(12) United States Patent
Yang et al.

(10) Patent No.: US 11,744,112 B2
(45) Date of Patent: Aug. 29, 2023

(54) DISPLAY SUBSTRATE INCLUDING A SHIELDING PATTERN ELECTRICALLY COUPLED WITH THE POWER SIGNAL LINE IN THE SUB-PIXEL AND METHOD FOR MANUFACTURING THE SAME, AND DISPLAY DEVICE HAVING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Huijuan Yang, Beijing (CN); Xiaofeng Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 215 days.

(21) Appl. No.: 17/237,824

(22) Filed: Apr. 22, 2021

(65) Prior Publication Data
US 2022/0102459 A1 Mar. 31, 2022

(30) Foreign Application Priority Data
Sep. 28, 2020 (CN) .......................... 202011043742.4

(51) Int. Cl.
*H01L 29/08* (2006.01)
*H10K 59/121* (2023.01)
(Continued)

(52) U.S. Cl.
CPC .......... *H10K 59/1216* (2023.02); *H04N 9/30* (2013.01); *H10K 59/126* (2023.02);
(Continued)

(58) Field of Classification Search
CPC ............. H01L 27/3265; H01L 27/3272; H01L 27/3276; H01L 51/56; H01L 2227/323
(Continued)

(56) References Cited

U.S. PATENT DOCUMENTS

| 9,666,132 B2* | 5/2017 | Wu | ...................... G09G 3/3291 |
| 2006/0091396 A1* | 5/2006 | Lee | ..................... H01L 27/1288 |
| | | | 257/72 |
| 2020/0168686 A1* | 5/2020 | Han | ..................... H01L 27/3276 |

* cited by examiner

*Primary Examiner* — Phuc T Dang
(74) *Attorney, Agent, or Firm* — BROOKS KUSHMAN P.C.

(57) ABSTRACT

The present application provides a display substrate and a method for manufacturing the same and a display device. In the display substrate, each sub-pixel includes: a power signal line; sub-pixel driver circuits and a shielding pattern. The sub-pixel driver circuit includes a driver transistor and a compensation transistor of double-gate structure. The shielding pattern is electrically coupled with the power signal line in the sub-pixel which is adjacent the shielding pattern in a second direction. There is an overlap area between an orthographic projection of the shielding pattern onto the base substrate and an orthographic projection of the conductor pattern onto the base substrate; the second direction intersects the first direction. The sub-pixels include multiple first sub-pixels and multiple second sub-pixels; the overlap area in the first sub-pixel is greater than the overlap area in the second sub-pixel.

20 Claims, 12 Drawing Sheets

(51) Int. Cl.
*H04N 9/30* (2006.01)
*H10K 59/126* (2023.01)
*H10K 59/131* (2023.01)
*H10K 71/00* (2023.01)
*H10K 59/12* (2023.01)

(52) U.S. Cl.
CPC ........... *H10K 59/131* (2023.02); *H10K 71/00* (2023.02); *H10K 59/1201* (2023.02)

(58) Field of Classification Search
USPC ........................................................ 257/40
See application file for complete search history.

DISPLAY SUBSTRATE INCLUDING A SHIELDING PATTERN ELECTRICALLY COUPLED WITH THE POWER SIGNAL LINE IN THE SUB-PIXEL AND METHOD FOR MANUFACTURING THE SAME, AND DISPLAY DEVICE HAVING THE SAME

CROSS-REFERENCE TO RELATED APPLICATION

This application claims priority to Chinese Patent Application No. 202011043742.4, filed on Sep. 28, 2020, which is incorporated herein by reference in its entirety.

TECHNICAL FIELD

The present application relates to the field of display technology, in particular to a display substrate, a method for manufacturing the same and a display device.

BACKGROUND

Compared with traditional liquid crystal displays, an active matrix organic light-emitting diode (AMOLED) display device has advantages such as self-luminescence, wide color gamut, high contrast, light and thin, and has been widely used in various fields in recent years.

The AMOLED display device includes a sub-pixel driver circuit. A gate voltage of a driver transistor in the sub-pixel driver circuit is easily interfered by other transistors, and is in an unstable state in a light-emitting stage. Instability of the gate voltage of the driver transistor may cause an anode voltage of a light-emitting element to change, and then the anode voltage of the light-emitting element undergoes a process from change to stability. Durations required for anode voltages of sub-pixels of different colors to reach a stable state are inconsistent, which causes deviations in brightness and chromaticity displayed by the sub-pixels in the durations, thereby leading to undesirable phenomenon of screen flickering on the display device.

SUMMARY

A first aspect of the present application provides a display substrate, including:

a base substrate; and an array of sub-pixels on the base substrate;

wherein each sub-pixel includes:

a power signal line; wherein at least part of the power signal line extends along a first direction;

sub-pixel driver circuits; wherein each sub-pixel driver circuit includes a driver transistor and a compensation transistor of double-gate structure; a first terminal of the driver transistor is electrically coupled with the power signal line; a first terminal of the compensation transistor is electrically coupled with a second terminal of the driver transistor; a second terminal of the compensation transistor is electrically coupled with a gate of the driver transistor; an active layer of the compensation transistor includes a first semiconductor pattern, a second semiconductor pattern, and a conductor pattern located between the first semiconductor pattern and the second semiconductor pattern;

a shielding pattern electrically coupled with the power signal line in the sub-pixel which is adjacent the shielding pattern in a second direction; wherein there is an overlap area between an orthographic projection of the shielding pattern onto the base substrate and an orthographic projection of the conductor pattern onto the base substrate; the second direction intersects the first direction;

wherein the sub-pixels include multiple first sub-pixels and multiple second sub-pixels; the overlap area in the first sub-pixel is greater than the overlap area in the second sub-pixel.

Optionally, the sub-pixels further include multiple third sub-pixels; and the overlap area in the third sub-pixel is less than the overlap area in the second sub-pixel.

Optionally, in each sub-pixel, the conductor pattern includes a corner portion, a first conductor portion and a second conductor portion; the first conductor portion is electrically connected to a first end of the corner portion; the second conductor portion is electrically connected to a second end of the corner portion; the first conductor portion extends in the first direction, and the second conductor portion extends in the second direction;

in the first sub-pixel, there is a first overlap area between an orthographic projection of the shielding pattern onto the base substrate and an orthographic projection of the corner portion onto the base substrate, and there is a second overlap area between the orthographic projection of the shielding pattern onto the base substrate and an orthographic projection of the first conductor portion onto the base substrate;

in the second sub-pixel, there is a first overlap area between an orthographic projection of the shielding pattern onto the base substrate and an orthographic projection of the corner portion onto the base substrate; and there is a third overlap area between the orthographic projection of the shielding pattern onto the base substrate and an orthographic projection of the first conductor portion onto the base substrate, the third overlap area is less than the second overlap area.

Optionally, the sub-pixels further include multiple third sub-pixels; and the overlap area in the third sub-pixel is less than the overlap area in the second sub-pixel.

Optionally, in the third sub-pixel, there is a first overlap area between an orthographic projection of the shielding pattern onto the base substrate and an orthographic projection of the corner portion onto the base substrate; there is no overlap area between the orthographic projection of the shielding pattern onto the base substrate and an orthographic projection of the first conductor portion onto the base substrate.

Optionally, in each sub-pixel, the shielding pattern includes a first sub-pattern, a second sub-pattern and a third sub-pattern; at least part of the first sub-pattern extends along the first direction; the second sub-pattern extends along the second direction; the second sub-pattern is located between the first sub-pattern and the third sub-pattern; the second sub-pattern is electrically coupled with the first sub-pattern and the third sub-pattern, respectively; there is an overlap area between an orthographic projection of the first sub-pattern onto the base substrate and an orthographic projection of the power signal line in the sub-pixel, which is adjacent the first sub-pattern in the second direction, onto the base substrate; the first sub-pattern is electrically coupled with the power signal line in the sub-pixel, which is adjacent the first sub-pattern in the second direction, in the overlap area between the orthographic projection of the first sub-pattern onto the base substrate and the orthographic projection of the power signal line in the sub-pixel, which is adjacent the first sub-pattern in the second direction, onto the base substrate; there is an overlap area between an orthographic projection of the third sub-pattern onto the base substrate and the orthographic projection of the conductor pattern onto the base substrate;

wherein a length of the third sub-pattern in the first sub-pixel along the first direction is greater than a length of the third sub-pattern in the second sub-pixel along the first direction.

Optionally, a length of the first conductor portion in the first sub-pixel along the first direction is greater than a length of the first conductor portion in the second sub-pixel along the first direction.

Optionally, a length of the third sub-pattern in the second sub-pixel along the first direction is greater than a length of the third sub-pattern in the third sub-pixel along the first direction.

Optionally, a length of the first conductor portion in the second sub-pixel along the first direction is greater than a length of the first conductor portion in the third sub-pixel along the first direction.

Optionally, the overlap area in the first sub-pixel is three times the overlap area in the third sub-pixel.

Optionally, the overlap area in the second sub-pixel is twice the overlap area in the third sub-pixel.

Optionally, the first sub-pixel includes a green sub-pixel; the second sub-pixel includes a red sub-pixel; and the third sub-pixel includes a blue sub-pixel.

Optionally, the sub-pixel further includes: a light-emitting element, a data line, an initialization signal line, a reset signal line, a gate line, and a light-emitting control signal line; at least part of the data line extends along the first direction; at least part of the initialization signal line, at least part of the reset signal line, at least part of the gate line and at least part of the light-emitting control signal line, extend along the second direction;

the sub-pixel driver circuit further includes: a first transistor, a fourth transistor, a fifth transistor, a sixth transistor, a seventh transistor, and a storage capacitor;

a gate of the first transistor is electrically coupled with the reset signal line; a first terminal of the first transistor is electrically coupled with the initialization signal line; a second terminal of the first transistor is electrically coupled with a gate of the driver transistor;

a gate of the compensation transistor is electrically coupled with the gate line;

a gate of the fourth transistor is electrically coupled with the gate line; a first terminal of the fourth transistor is electrically coupled with the data line; a second terminal of the fourth transistor is electrically coupled with a first terminal of the driver transistor;

the first terminal of the driver transistor is electrically coupled with the power signal line through the fifth transistor; a gate of the fifth transistor is electrically coupled with the light-emitting control signal line; a first terminal of the fifth transistor is electrically coupled with the power signal line; a second terminal of the fifth transistor is electrically coupled with the first terminal of the driver transistor;

a gate of the sixth transistor is electrically coupled with light-emitting control signal line; a first terminal of the sixth transistor is electrically coupled with the second terminal of the driver transistor; a second terminal of the sixth transistor is electrically coupled with the light-emitting element;

a gate of the seventh transistor is electrically coupled with the reset signal line in the next sub-pixel which is adjacent the seventh transistor along the first direction; a first terminal of the seventh transistor is electrically coupled with the initialization signal line in the next sub-pixel which is adjacent the seventh transistor along the first direction; a second terminal of the seventh transistor is electrically coupled with the light-emitting element;

a first electrode plate of the storage capacitor is reused as the gate of the driver transistor, and a second electrode plate of the storage capacitor is electrically coupled with the power signal line.

Based on the foregoing technical solution of the display substrate, a second aspect of the present application provides a display device including the foregoing display substrate.

Based on the foregoing technical solution of the display substrate, a third aspect of the present application provides a method for manufacturing the foregoing display substrate, including: fabricating sub-pixels arranged in an array on a base substrate;

wherein each sub-pixel is fabricated in a way including:
fabricating a power signal line with at least part of the power signal line extending along a first direction;

fabricating sub-pixel driver circuits, wherein each sub-pixel driver circuit includes a driver transistor and a compensation transistor of double-gate structure, a first terminal of the driver transistor is electrically coupled with the power signal line, a first terminal of the compensation transistor is electrically coupled with a second terminal of the driver transistor, a second terminal of the compensation transistor is electrically coupled with a gate of the driver transistor, and an active layer of the compensation transistor includes a first semiconductor pattern, a second semiconductor pattern, and a conductor pattern located between the first semiconductor pattern and the second semiconductor pattern;

fabricating a shielding pattern, wherein the shielding pattern is electrically coupled with the power signal line in the sub-pixel which is adjacent the shielding pattern along the second direction, and there is an overlap area between an orthographic projection of the shielding pattern onto the base substrate and an orthographic projection of the conductor pattern onto the base substrate, and the second direction intersects the first direction;

wherein the sub-pixels include multiple first sub-pixels and multiple second sub-pixels, and the overlap area in the first sub-pixel is greater than the overlap area in the second sub-pixel.

It is to be understood that the contents in this section are not intended to identify the key or critical features of the embodiments of the present application, and are not intended to limit the scope of the present application. Other features of the present application will become readily apparent from the following description.

BRIEF DESCRIPTION OF THE DRAWINGS

The drawings are included to provide a better understanding of the application and are not to be construed as limiting the application. Wherein.

DETAILED DESCRIPTION

Reference will now be made in detail to the exemplary embodiments of the present application, examples of which are illustrated in the accompanying drawings, wherein the various details of the embodiments of the present application are included to facilitate understanding and are to be considered as exemplary only. Accordingly, a person skilled in the art should appreciate that various changes and modifications can be made to the embodiments described herein without departing from the scope and spirit of the present application. Also, descriptions of well-known functions and structures are omitted from the following description for clarity and conciseness.

The terms such as "first" and "second" in the specification and claims of the present application are merely used to differentiate similar components rather than to represent any order or sequence. It is to be understood that the data so used may be interchanged where suitable, such that the embodiments of the present application described herein may be implemented in a sequence other than those illustrated or described herein. In addition, the terms "include" and "have" or their variations are intended to encompass a non-exclusive inclusion, such that a process, method, system, product, or device that include a series of steps or units include not only those steps or units that are explicitly listed but also other steps or units that are not explicitly listed, or steps or units that are inherent to such process, method, product, or device. In the specification and claims, "and/or" means at least one of the connected objects.

In order to further illustrate a display substrate, a method for manufacturing the same and a display device according to embodiments of the present application, a detailed description is described hereinafter with reference to the accompanying drawings of the specification.

Figure 1:
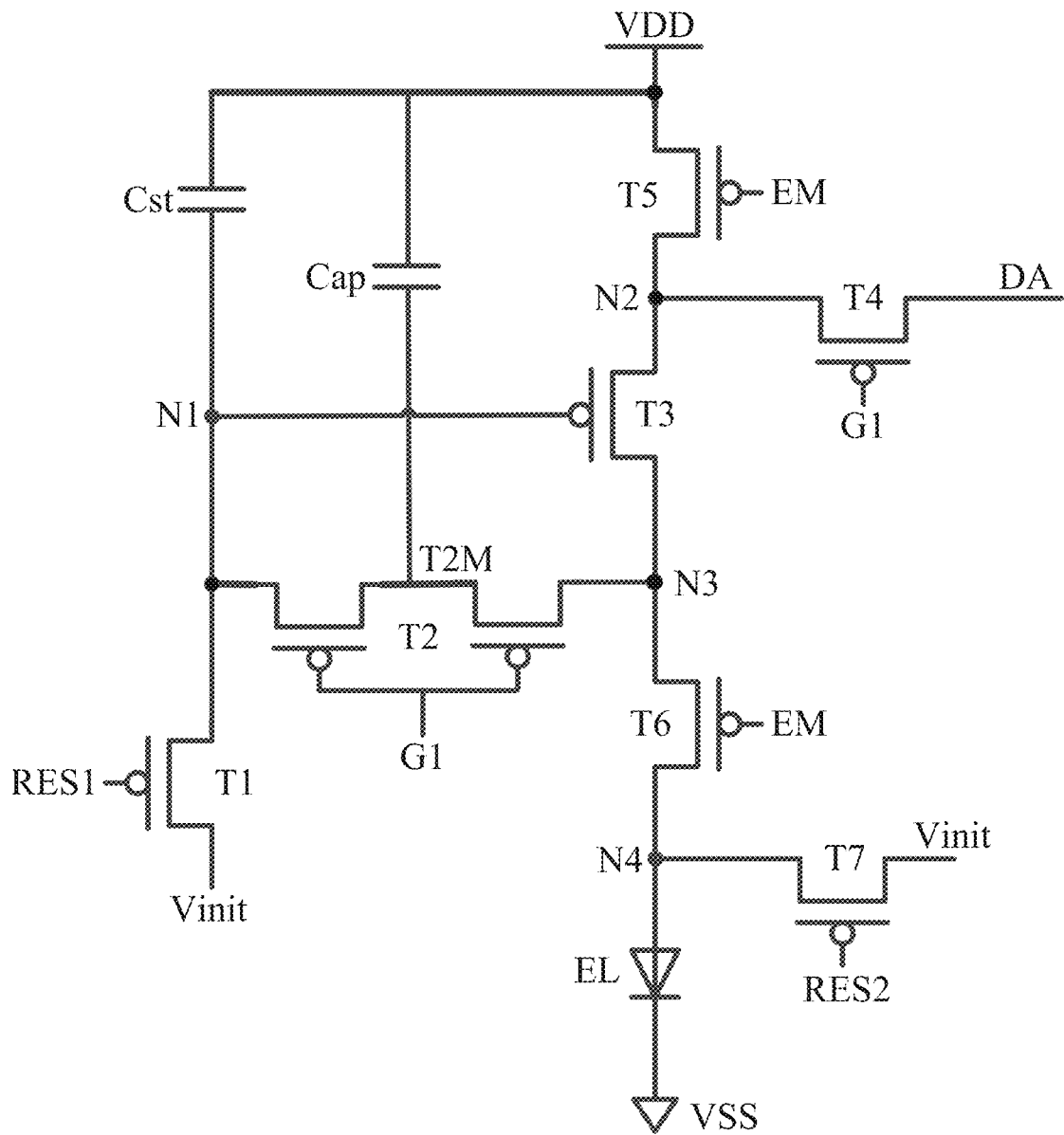
FIG. 1 is a schematic diagram showing a circuit structure of a sub-pixel driver circuit according to an embodiment of the present application.
Figure 3:
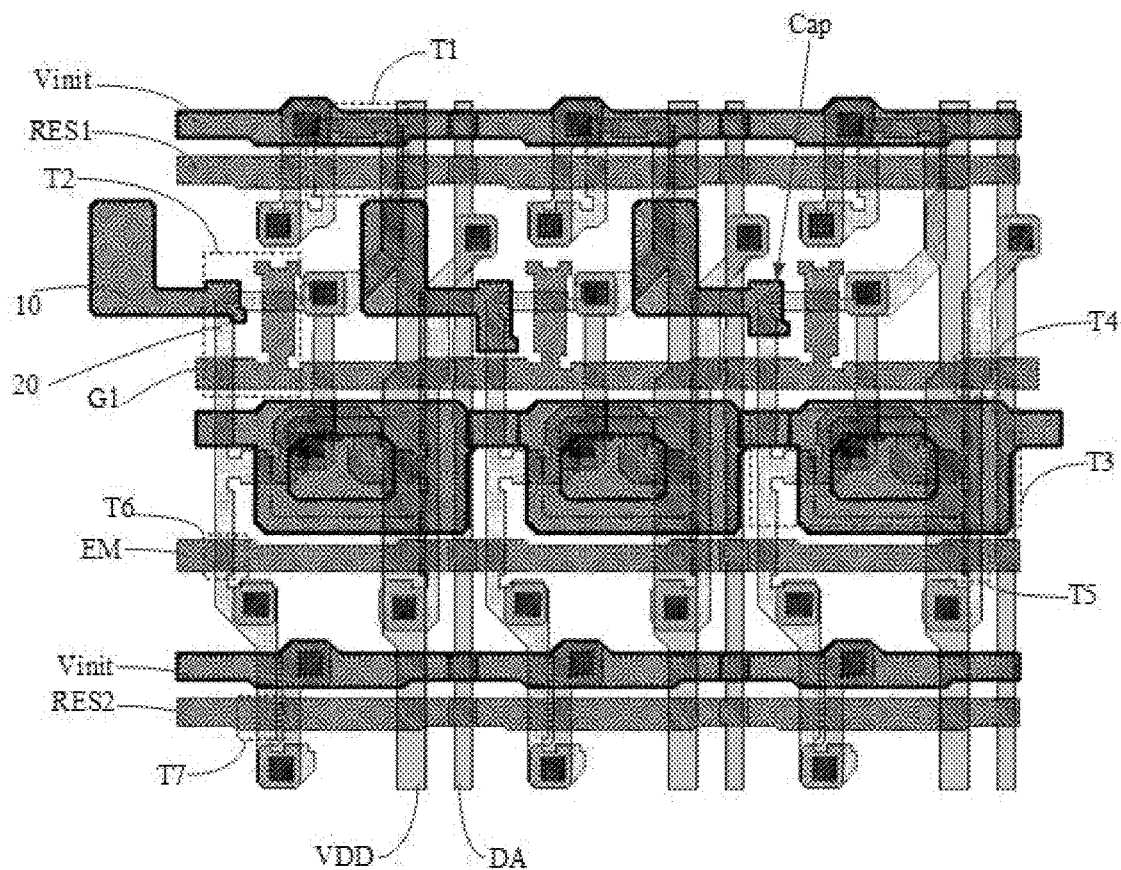
FIG. 3 is a schematic diagram of a layout of three sub-pixels according to an embodiment of the present application.

As shown in FIG. 1 and FIG. 3, a display substrate is provided in one embodiment of the present application and includes a plurality of sub-pixels. Each sub-pixel includes a sub-pixel driver circuit. Multiple sub-pixel driver circuits included in the multiple sub-pixels are arranged in an array on a base substrate of the display substrate. Each sub-pixel driver circuit includes a first transistor T1 to a seventh transistor T7, and a storage capacitor Cst. The second transistor T2 serves as a compensation transistor in the sub-pixel driver circuit. The third transistor T3 serves as a driver transistor in the sub-pixel driver circuit. The compensation transistor has a double-gate structure. A first terminal of the compensation transistor is electrically coupled with a first terminal of the driver transistor. A second terminal of the compensation transistor is electrically coupled with a gate of the driver transistor. A second terminal of the driver transistor is electrically coupled with an anode of a light-emitting element in the sub-pixel.

When the sub-pixel driver circuit is in operation, due to leakage of the compensation transistor of the double-gate structure, a voltage at an N1 node in a light-emitting stage is unstable, and then a gate voltage of the driver transistor is always in a changing state, resulting in that a voltage at an N4 node is in a changing state.

As shown in FIG. 1, FIG. 3, and FIG. 17a to FIG. 17c, the compensation transistor has a double-gate structure. An active layer of the compensation transistor generally includes a first semiconductor pattern, a second semiconductor pattern, and a semiconductor pattern 20 located between the first semiconductor pattern and the second semiconductor pattern. The conductor pattern 20 is connected with the first semiconductor pattern and the second semiconductor pattern, respectively. Each sub-pixel further includes a shielding pattern 10. The shielding pattern 10 is electrically coupled with a power signal line VDD in the sub-pixel, so that the shielding pattern 10 has a stable potential. An orthographic projection of the shielding pattern 10 onto the base substrate overlaps an orthographic projection of the conductor pattern 20 onto the base substrate, so that the shielding pattern 10 can shield external interference to the conductor pattern 20, thereby improving the leakage of the compensation transistor.

Figure 4:
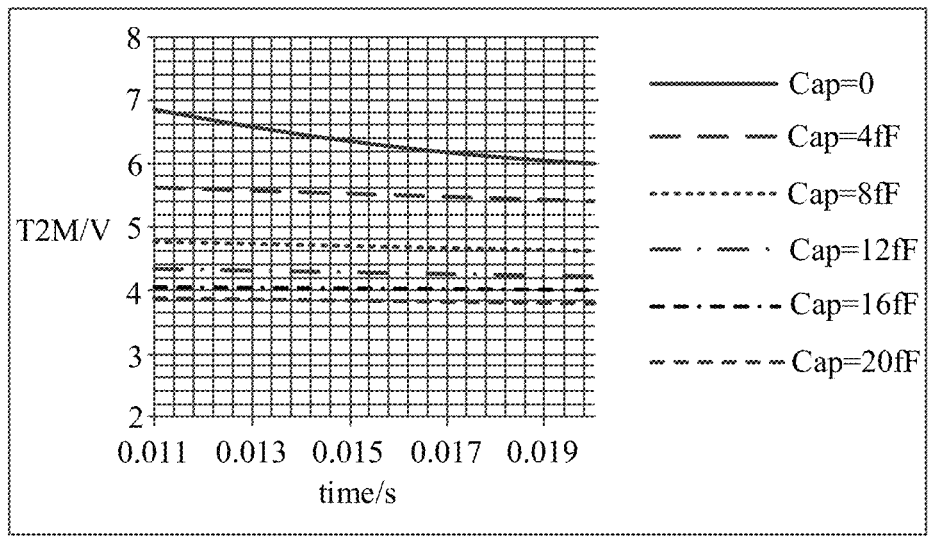
FIG. 4 is a schematic diagram showing changes of a T2M node in a red sub-pixel in one frame when a shielding capacitor has different capacitance values.
Figure 5:
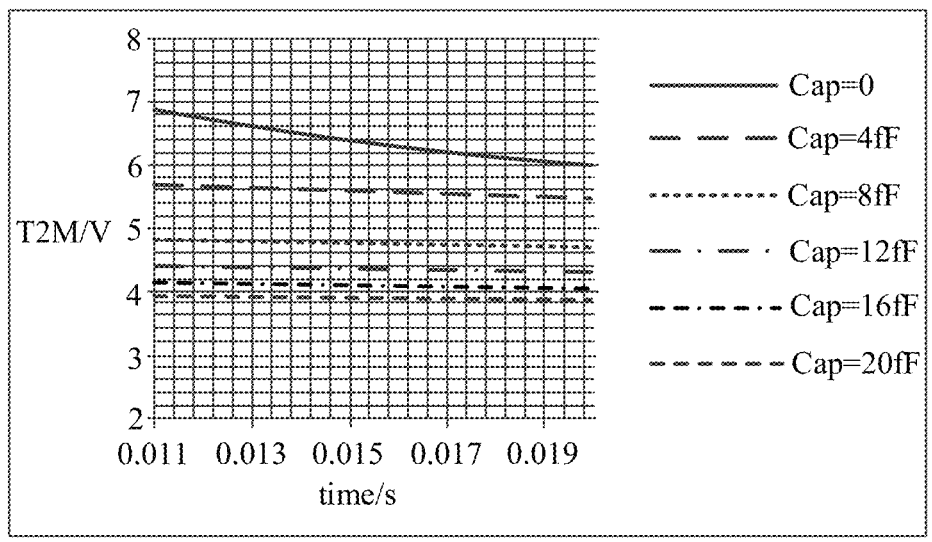
FIG. 5 is a schematic diagram showing changes of a T2M node in a green sub-pixel in one frame when a shielding capacitor has different capacitance values.
Figure 6:
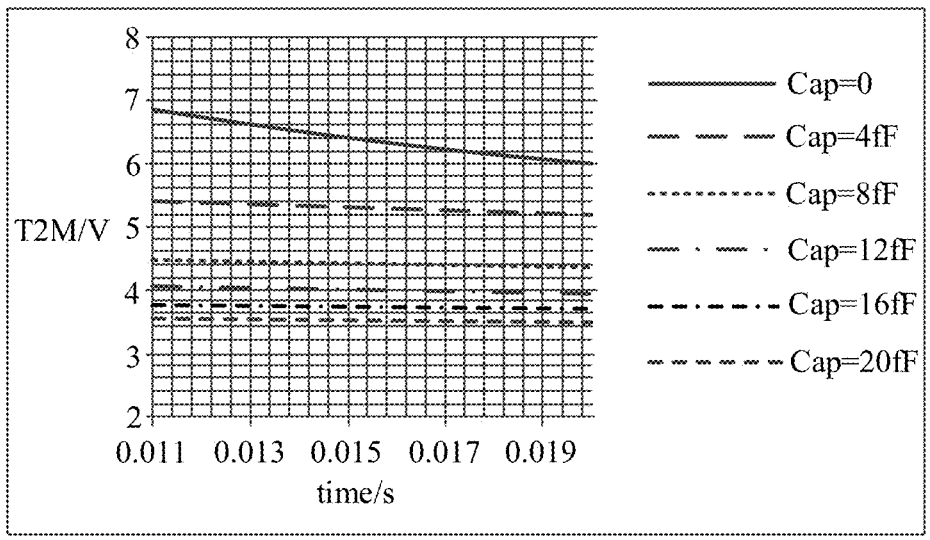
FIG. 6 is a schematic diagram showing changes of a T2M node in a blue sub-pixel in one frame when a shielding capacitor has different capacitance values.

Taking the multiple sub-pixels including a red sub-pixel, a green sub-pixel and a blue sub-pixel as an example, it is found through research that: a shielding capacitor Cap is formed between the shielding pattern 10 and the conductor pattern 20. As shown in FIG. 4, FIG. 4 shows changes of a voltage at a T2M node (i.e., a voltage at the conductor pattern 20) in a red sub-pixel in one frame when the shielding capacitor Cap has different capacitance values. As shown in FIG. 5, FIG. 5 shows changes of a voltage at the T2M node in a green sub-pixel in one frame when the shielding capacitor Cap has different capacitance values. As shown in FIG. 6, FIG. 6 shows changes of a voltage at the T2M node in a blue sub-pixel in one frame when the shielding capacitor Cap has different capacitance values. As can be seen from FIG. 4, FIG. 5 and FIG. 6, the larger the value of the shielding capacitor Cap is, the smaller the voltage at the T2M node changes within one frame. In the red sub-pixel, the green sub-pixel and the blue sub-pixel, changes of the voltages at the T2M node presents the same trend.

Figure 7:
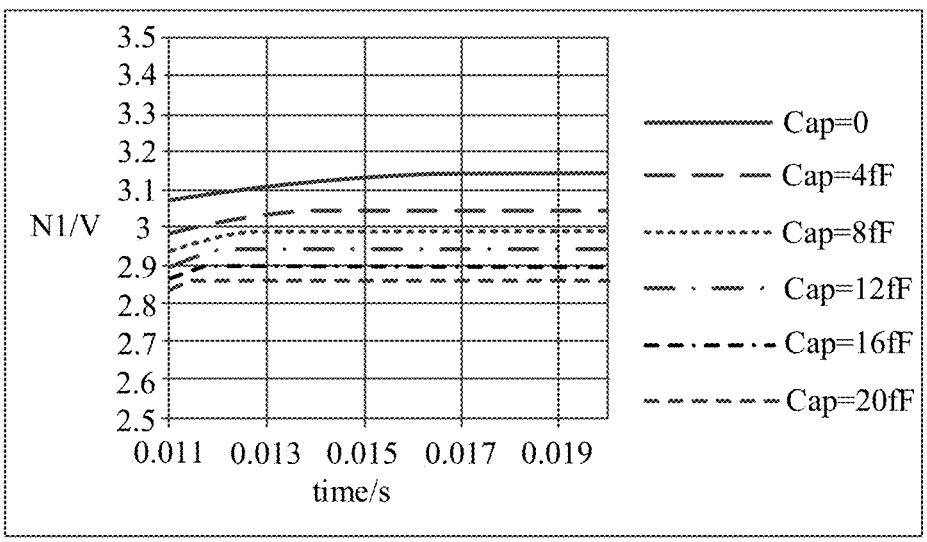
FIG. 7 is a schematic diagram showing changes of an N1 node in a red sub-pixel in one frame when a shielding capacitor has different capacitance values.
Figure 8:
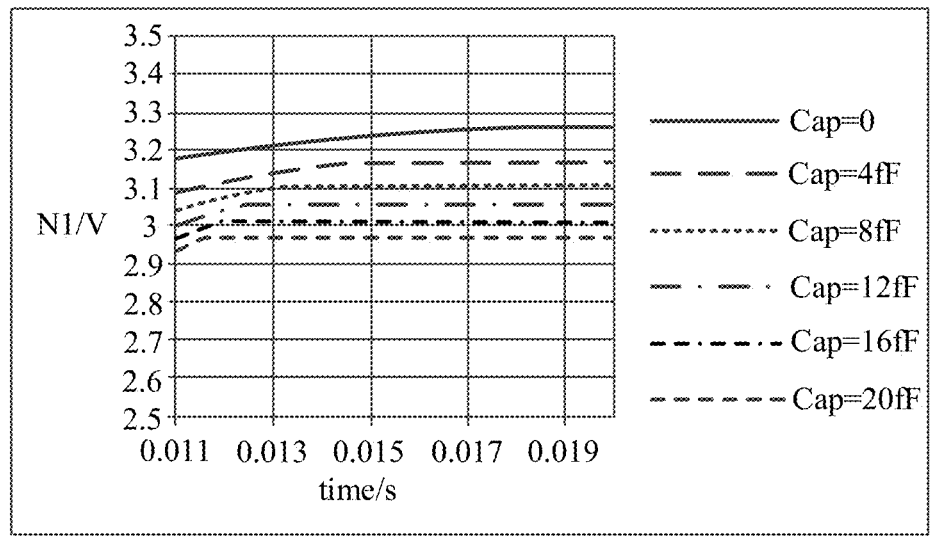
FIG. 8 is a schematic diagram showing changes of an N1 node in a green sub-pixel in one frame when a shielding capacitor has different capacitance values.
Figure 9:
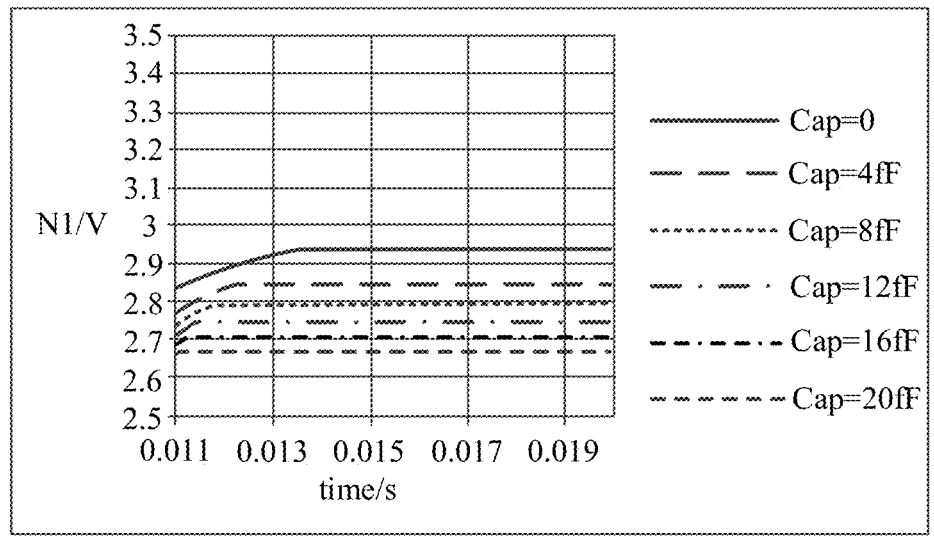
FIG. 9 is a schematic diagram showing changes of an N1 node in a blue sub-pixel in one frame when a shielding capacitor has different capacitance values.

As shown in FIG. 7, FIG. 7 shows changes of a voltage at an N1 node in a red sub-pixel in one frame when the shielding capacitor Cap has different capacitance values. As shown in FIG. 8, FIG. 8 shows changes of a voltage at the N1 node in a green sub-pixel in one frame when the shielding capacitor Cap has different capacitance values. As shown in FIG. 9, FIG. 9 shows changes of a voltage at the N1 node in a blue sub-pixel in one frame when the shielding capacitor Cap has different capacitance values. As can be seen from FIG. 7, FIG. 8 and FIG. 9, the larger the value of the shielding capacitor Cap is, the shorter the time it takes for the voltage at the N1 node to change from a changing state to a stable state in one frame. In the red sub-pixel, the green sub-pixel and the blue sub-pixel, changes of the voltages at the N1 node presents the same trend. When the shielding capacitor Cap has the same capacitance value, it takes a shortest time for the voltage at the N1 node in the blue sub-pixel to change from a changing state to a stable state in one frame; it takes a longest time for the voltage at the N1 node in the green sub-pixel to change from a changing state to a stable state in one frame; and time required for the voltage at the N1 node in the red sub-pixel to change from a changing state to a stable state, is greater than time required for the voltage at the N1 node in the blue sub-pixel and is less than time required for the voltage at the N1 node in the green sub-pixel.

Figure 10:
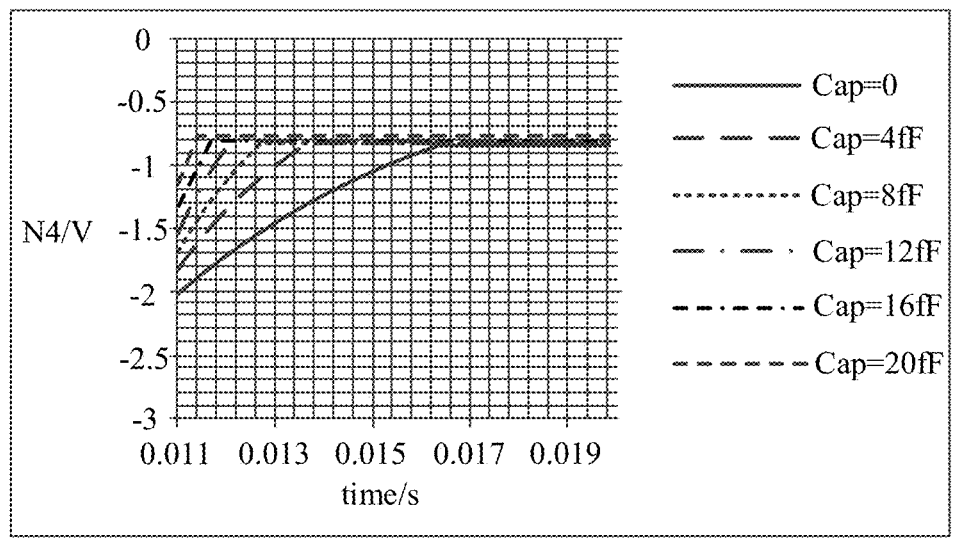
FIG. 10 is a schematic diagram showing changes of an N4 node in a red sub-pixel in one frame when a shielding capacitor has different capacitance values.
Figure 11:
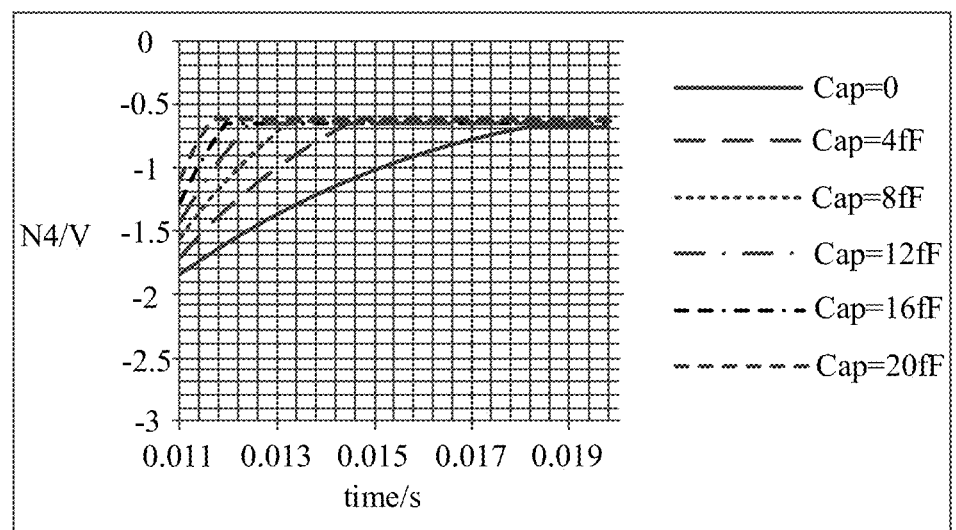
FIG. 11 is a schematic diagram showing changes of an N4 node in a green sub-pixel in one frame when a shielding capacitor has different capacitance values.
Figure 12:
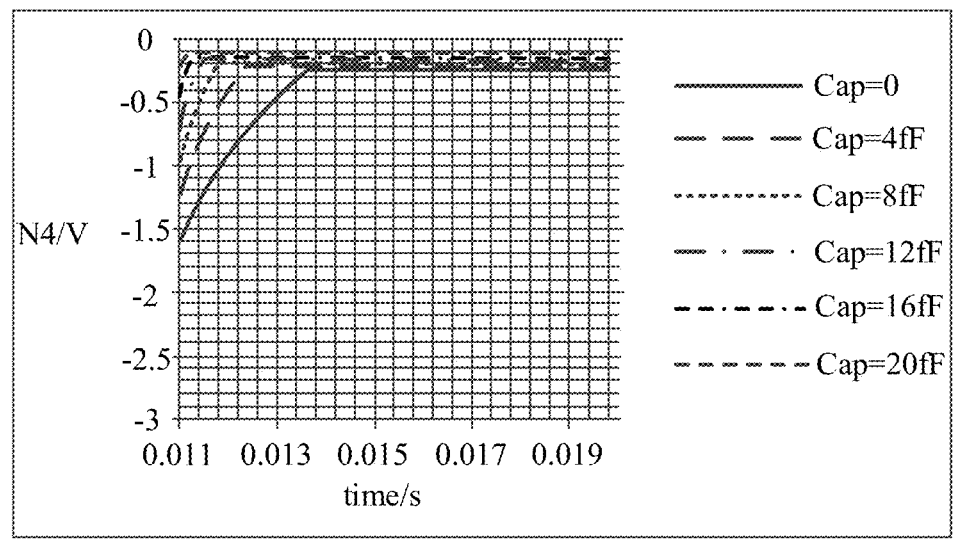
FIG. 12 is a schematic diagram showing changes of an N4 node in a blue sub-pixel in one frame when a shielding capacitor has different capacitance values.

As shown in FIG. 10, FIG. 10 shows changes of an N4 node in a red sub-pixel in one frame when the shielding capacitor Cap has different capacitance values. As shown in FIG. 11, FIG. 11 shows changes of an N4 node in a green sub-pixel in one frame when the shielding capacitor Cap has different capacitance values. As shown in FIG. 12, FIG. 12 shows changes of an N4 node in a blue sub-pixel in one frame when the shielding capacitor Cap has different capacitance values. As can be seen from FIG. 10, FIG. 11 and FIG. 12, the larger the value of the shielding capacitor Cap is, the shorter the time it takes for the voltage at the N4 node to change from a changing state to a stable state in one frame. In the red sub-pixel, the green sub-pixel and the blue sub-pixel, changes of the voltages at the N4 node presents the same trend. When the shielding capacitor Cap has the same capacitance value, it takes a shortest time for the voltage at the N4 node in the blue sub-pixel to change from a changing state to a stable state in one frame; it takes a longest time for the voltage at the N4 node in the green sub-pixel to change from a changing state to a stable state in one frame; and time required for the voltage at the N4 node in the red sub-pixel to change from a changing state to a stable state, is greater than time required for the voltage at the N4 node in the blue sub-pixel and is less than time required for the voltage at the N4 node in the green sub-pixel. Since the N4 node directly affects displaying of the light-emitting element, the voltage change at the N4 node is particularly important.

Figure 13:
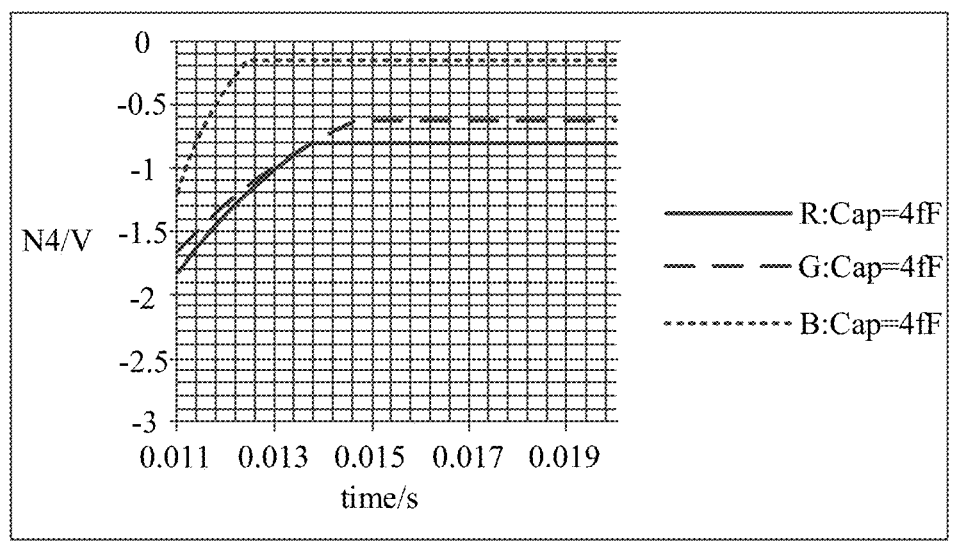
FIG. 13 is a first schematic diagram showing changes of the N4 node in red, green and blue sub-pixels in one frame according to an embodiment of the present application.

Based on the above findings, it can be seen that the capacitance value of the shielding capacitor Cap affects the voltage at the T2M node, the voltage at the N1 node, and the voltage at the N4 node. Further, when the shielding capacitors Cap in the sub-pixels of different colors are set to have the same capacitance value, durations required for the N4 node to reach stable display in the sub-pixels of different colors are not consistent. Specifically, as shown in FIG. 13, when shielding capacitors Cap in a red sub-pixel R, a green sub-pixel G and a blue sub-pixel B have the same capacitance value, durations required for the N4 node to reach stable display in the red sub-pixel R, the green sub-pixel G and the blue sub-pixel B are not consistent, which causes that chromaticity and brightness displayed by each sub-pixel are not up to standard in nearly 50% of the time in a frame, resulting in deviations in brightness and chromaticity displayed by various sub-pixels in the durations, thereby leading to undesirable phenomenon of screen flickering on the display device.

In view of the foregoing problems, the present application provides a display substrate, a method for manufacturing the same and a display device, which can solve the problems that durations required for anode voltages of sub-pixels of different colors to reach a stable state are inconsistent, which causes deviations in brightness and chromaticity displayed by the sub-pixels in the durations, thereby leading to undesirable phenomenon of screen flickering on the display device. Technical solutions of the present application are described hereinafter.

Referring to FIG. 1 and FIG. 3, one embodiment of the present application provides a display substrate, including: a base substrate and multiple sub-pixels arranged on the base substrate. The multiple sub-pixels are arranged in an array. Each sub-pixel includes: a power signal line VDD, sub-pixel driver circuits, and a shielding pattern 10.

At least part of the power signal line VDD extends along a first direction.

Each sub-pixel driver circuit includes a driver transistor and a compensation transistor of double-gate structure. A first terminal of the driver transistor is electrically coupled with the power signal line VDD. A first terminal of the compensation transistor is electrically coupled with a second terminal of the driver transistor. A second terminal of the compensation transistor is electrically coupled with a gate of the driver transistor. An active layer of the compensation transistor includes a first semiconductor pattern, a second semiconductor pattern, and a conductor pattern 20 located between the first semiconductor pattern and the second semiconductor pattern.

The shielding pattern 10 is electrically coupled with the power signal line VDD in the sub-pixel which is adjacent the shielding pattern 10 in a second direction. There is an overlap area between an orthographic projection of the shielding pattern 10 onto the base substrate and an orthographic projection of the conductor pattern 20 onto the base substrate. The second direction intersects the first direction.

The multiple sub-pixels include multiple first sub-pixels and multiple second sub-pixels. The overlap area in the first sub-pixel is greater than the overlap area in the second sub-pixel.

Specifically, each sub-pixel includes a power signal line VDD. At least part of the power signal line VDD extends along a first direction. In the sub-pixels in the same column along the first direction, power signal lines VDD in various sub-pixels are electrically connected in sequence. For example, the power signal lines VDD in various sub-pixels are formed as an integral structure.

Each sub-pixel includes a sub-pixel driver circuit and a light-emitting element. The sub-pixel driver circuit as a whole is located between the base substrate and the light-emitting element. For example, the sub-pixel driver circuit includes a driver transistor; and the light-emitting element includes an anode and a cathode disposed opposite to each other, and an organic light-emitting material layer located between the anode and the cathode. A second terminal of the driver transistor is electrically coupled with the anode, and is used to provide a driving signal for the anode to drive the organic light-emitting material layer to emit light.

The sub-pixel driver circuit further includes a compensation transistor. The compensation transistor is coupled between the second terminal and a gate of the driver transistor. The compensation transistor is configured to, in a compensation period, write a threshold voltage of the driver transistor to the gate of the driver transistor, thereby compensating the threshold voltage of the driver transistor.

The compensation transistor employs a double-gate structure. An active layer of the compensation transistor includes a first semiconductor pattern, a second semiconductor pattern and a conductor pattern 20. Both the first semiconductor pattern and the second semiconductor pattern are covered by the gate of the compensation transistor. The conductor pattern 20 is located between the first semiconductor pattern and the second semiconductor pattern. The conductor pattern 20 is coupled with the first semiconductor pattern and the second semiconductor pattern, respectively.

Each sub-pixel further includes a shielding pattern 10. For example, there is an overlap area between an orthographic projection of the shielding pattern 10 onto the base substrate, and an orthographic projection of the power signal line VDD in the sub-pixel, which is adjacent the shielding pattern 10 in the second direction, onto the base substrate. In the overlap area, the shielding pattern 10 is electrically coupled with the power signal line VDD in the adjacent sub-pixel, so that the shielding pattern 10 has the same fixed voltage as the power signal line VDD. For example, the first direction may be a vertical direction, and the second direction may be a horizontal direction.

Since the orthographic projection of the shielding pattern 10 onto the base substrate overlaps the orthographic projection of the conductor pattern 20 onto the base substrate, a shielding capacitor Cap is formed between the shielding pattern 10 and the conductor pattern 20. A capacitance value of the shielding capacitor Cap is related to the overlap area between the orthographic projection of the shielding pattern 10 onto the base substrate and the orthographic projection of the conductor pattern 20 onto the base substrate.

The display substrate includes an active material layer, a first gate insulating layer, a first gate metal layer, a second gate insulating layer, a second gate metal layer, an interlayer insulating layer and a first source-drain metal layer, which are stacked on the base substrate in a direction away from the base substrate. The active material layer can form the active layer in the compensation transistor. The second gate metal layer can form the shielding pattern 10. The first source-drain metal layer can form the power signal line VDD.

The multiple sub-pixels include multiple first sub-pixels and multiple second sub-pixels. A light-emitting color of the first sub-pixel is different from a light-emitting color of the second sub-pixel. For example, the first sub-pixel includes a green sub-pixel, and the second sub-pixel includes a red sub-pixel.

According to the specific structure of the foregoing display substrate, in the display substrate provided in the embodiment of the present application, by setting the overlap area in the first sub-pixel to be greater than the overlap area in the second sub-pixel, a capacitance value of the shielding capacitor Cap in the first sub-pixel is different from a capacitance value of the shielding capacitor Cap in the second sub-pixel. By setting suitable capacitance values for the shielding capacitor Cap in the first sub-pixel and the shielding capacitor Cap in the second sub-pixel, it can make leakage of the compensation transistor uniform in a light-emitting stage, in the first sub-pixel and the second sub-pixel. In this way, in the first sub-pixel and the second sub-pixel, voltages at the N4 node can reach a stable state at the same time, so that there is a difference in brightness of the first sub-pixel and the second sub-pixel only when the voltages at the N4 node are not stable and when the voltages at the N4 node are stable without difference in chromaticity, which can effectively improve the undesirable phenomenon of screen flickering when the display substrate is applied to the display device, thereby improving display image quality of the display device and greatly improving user experience of the display device in application.

In some embodiments, the multiple sub-pixels further include multiple third sub-pixels. The overlap area in the third sub-pixel is less than the overlap area in the second sub-pixel.

For example, the third sub-pixel includes a blue sub-pixel.

The foregoing arrangement makes a capacitance value of the shielding capacitor Cap in the third sub-pixel different from the capacitance value of the shielding capacitor Cap in the second sub-pixel. By setting suitable capacitance values for the shielding capacitor Cap in the third sub-pixel and the shielding capacitor Cap in the second sub-pixel, it can make leakage of the compensation transistor uniform in a light-emitting stage, in the third sub-pixel and the second sub-pixel. In this way, in the third sub-pixel and the second sub-pixel, voltages at the N4 node can reach a stable state at the same time, so that there is a difference in brightness of the third sub-pixel and the second sub-pixel only when the voltages at the N4 node are not stable and when the voltages at the N4 node are stable without difference in chromaticity, which can effectively improve the undesirable phenomenon of screen flickering when the display substrate is applied to the display device, thereby improving display image quality of the display device and greatly improving user experience of the display device in application.

In addition, when it is set that the overlap area in the first sub-pixel is greater than the overlap area in the second sub-pixel as well as the overlap area in the third sub-pixel is less than the overlap area in the second sub-pixel, by setting suitable capacitance values for the shielding capacitor Cap in the first sub-pixel, the shielding capacitor Cap in the second sub-pixel and the shielding capacitor Cap in the third sub-pixel, it can effectively shorten the time required for the voltage at the N4 node to reach a stable state, thereby better improving display quality of the display device when the display substrate is applied to the display device.

As shown in FIG. 15a to FIG. 15c and FIG. 16a to FIG. 16c, in some embodiments, in each sub-pixel, the conductor pattern 20 includes a corner portion 201, a first conductor portion 202 and a second conductor portion 203. The first conductor portion 202 is electrically connected to a first end of the corner portion 201. The second conductor portion 203 is electrically connected to a second end of the corner portion 201. The first conductor portion 202 extends in the first direction, and the second conductor portion 203 extends in the second direction.

Figure 15A:
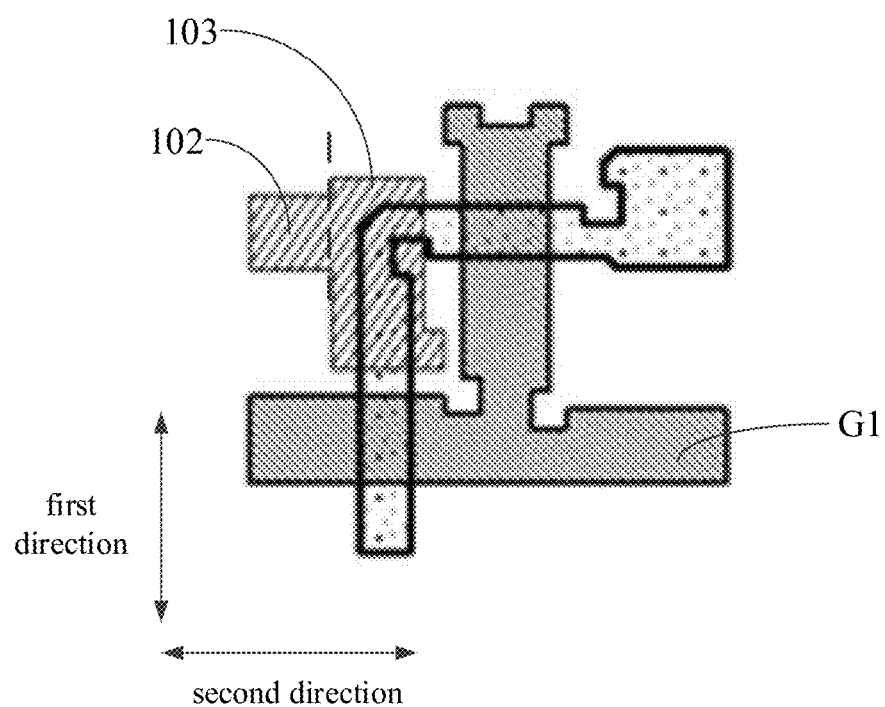
FIG. 15a is a schematic diagram of overlapping of a third sub-pattern and a conductor pattern in a first sub-pixel according to an embodiment of the present application.
Figure 15B:
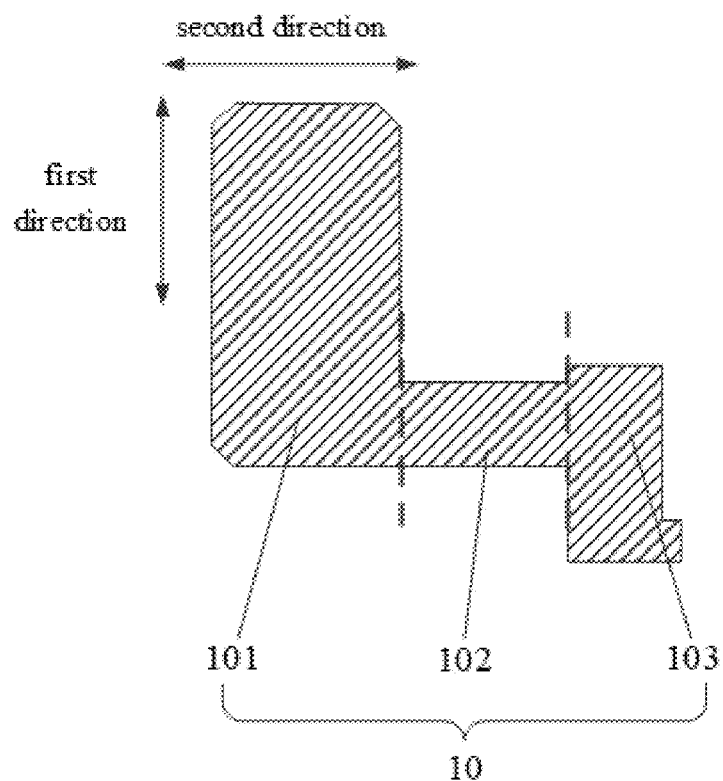
FIG. 15b is a schematic diagram of a shielding pattern in a first sub-pixel according to an embodiment of the present application.
Figure 15C:
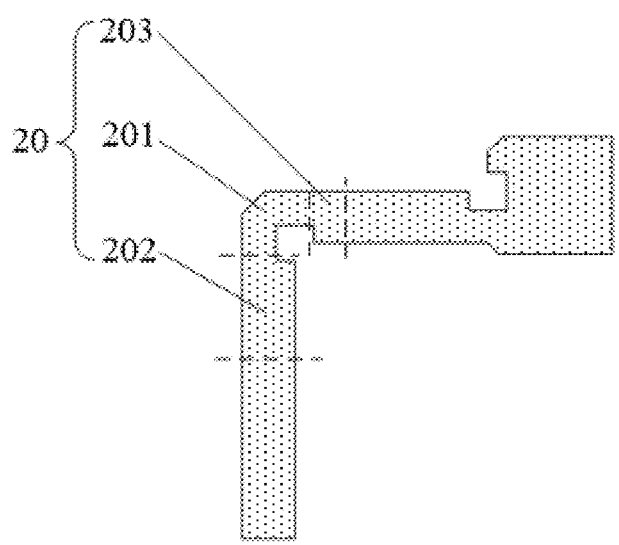
FIG. 15c is a schematic diagram of a conductor pattern in a first sub-pixel according to an embodiment of the present application.

As shown in FIG. 15*a* to FIG. 15*c*, in the first sub-pixel, there is a first overlap area between an orthographic projection of the shielding pattern 10 onto the base substrate and an orthographic projection of the corner portion 201 onto the base substrate. There is a second overlap area between the orthographic projection of the shielding pattern 10 onto the base substrate and an orthographic projection of the first conductor portion 202 onto the base substrate.

Figure 16A:
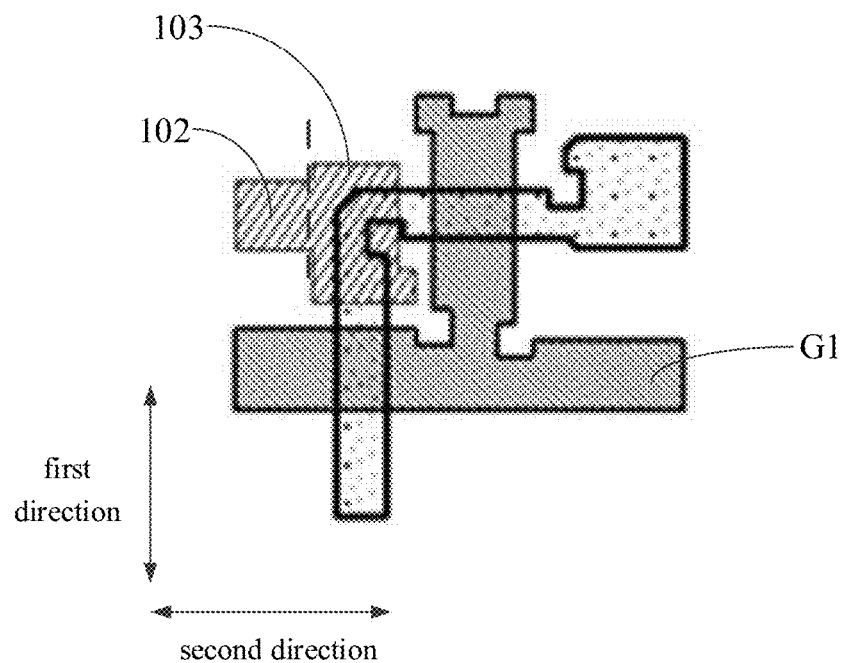
FIG. 16a is a schematic diagram of overlapping of a third sub-pattern and a conductor pattern in a second sub-pixel according to an embodiment of the present application.
Figure 16B:
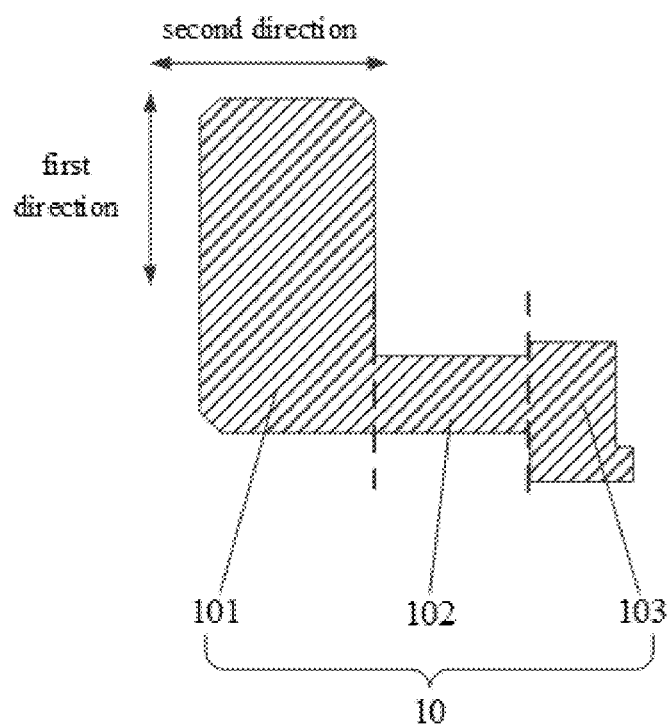
FIG. 16b is a schematic diagram of a shielding pattern in a second sub-pixel according to an embodiment of the present application.
Figure 16C:
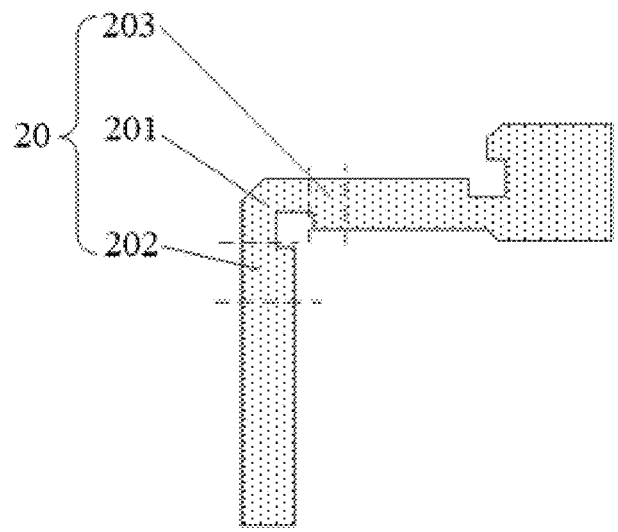
FIG. 16c is a schematic diagram of a conductor pattern in a second sub-pixel according to an embodiment of the present application.

As shown in FIG. 16*a* to FIG. 16*c*, in the second sub-pixel, there is a first overlap area between an orthographic projection of the shielding pattern 10 onto the base substrate and an orthographic projection of the corner portion 201 onto the base substrate. There is a third overlap area between the orthographic projection of the shielding pattern 10 onto the base substrate and the orthographic projection of the first conductor portion 202 onto the base substrate. The third overlap area is less than the second overlap area.

Specifically, in each sub-pixel, the conductor pattern 20 includes the corner portion 201, the first conductor portion 202 and the second conductor portion 203. The conductor pattern 20 is L-shaped.

The first overlap area between the orthographic projection of the shielding pattern 10 onto the base substrate and the orthographic projection of the corner portion 201 onto the base substrate in the first sub-pixel, is equal to the first overlap area between the orthographic projection of the shielding pattern 10 onto the base substrate and the orthographic projection of the corner portion 201 onto the base substrate in the second sub-pixel. In the first sub-pixel, there is a second overlap area between the orthographic projection of the shielding pattern 10 onto the base substrate and an orthographic projection of the first conductor portion 202 onto the base substrate. In the second sub-pixel, there is a third overlap area between the orthographic projection of the shielding pattern 10 onto the base substrate and the orthographic projection of the first conductor portion 202 onto the base substrate. By setting the third overlap area to be less than the second overlap area, the capacitance value of the shielding capacitor Cap in the second sub-pixel is less than the capacitance value of the shielding capacitor Cap in the first sub-pixel.

In the display substrate provided in the foregoing embodiment, by setting suitable second overlap area and third overlap area, the shielding capacitor Cap in the first sub-pixel and the shielding capacitor Cap the second sub-pixel can have suitable capacitance values, so that in the first sub-pixel and the second sub-pixel, leakage of the compensation transistor is uniform in a light-emitting stage, and voltages at the N4 node can reach a stable state at the same time.

Figure 17A:
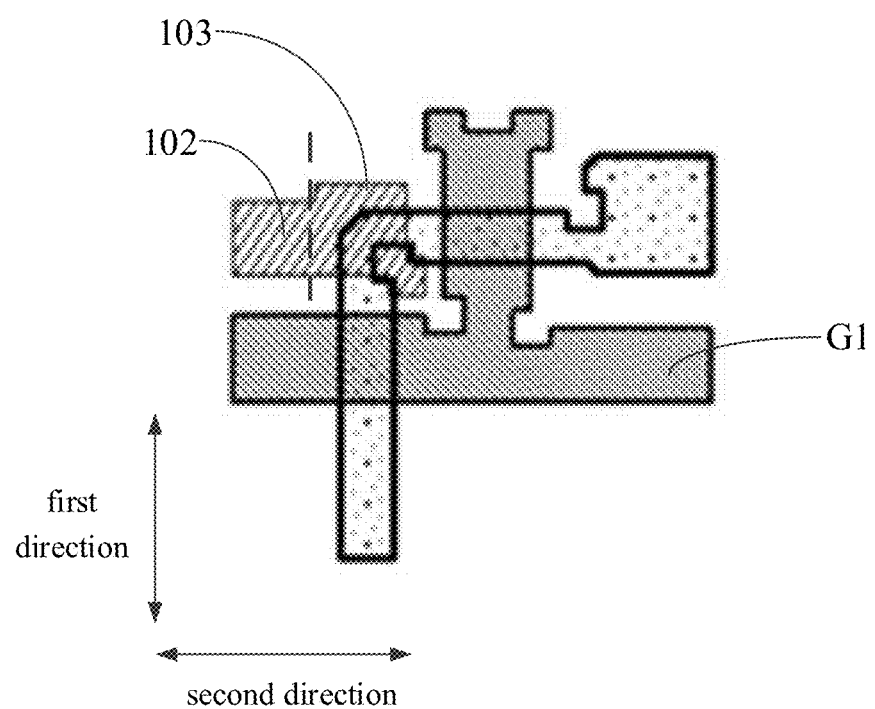
FIG. 17a is a schematic diagram of overlapping of a third sub-pattern and a conductor pattern in a third sub-pixel according to an embodiment of the present application.
Figure 17B:
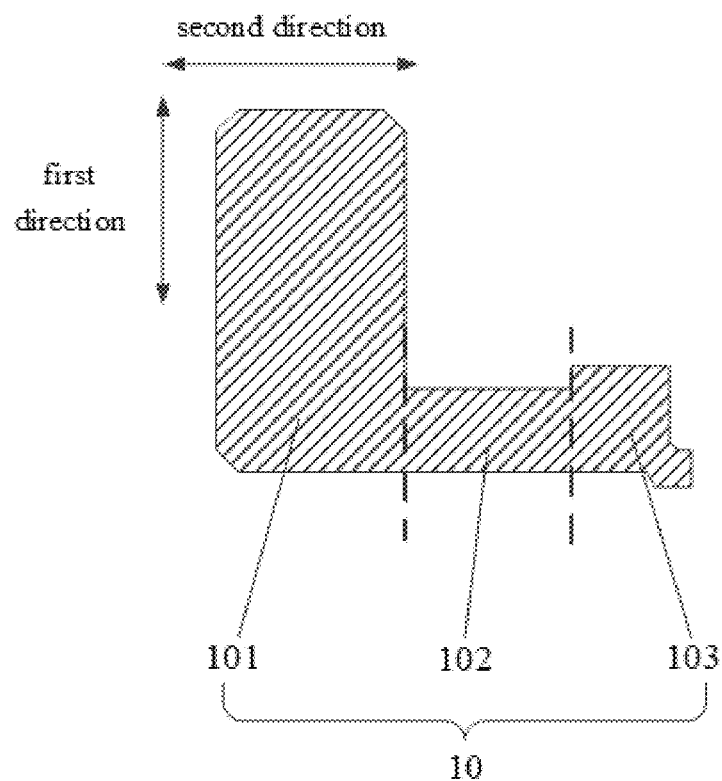
FIG. 17b is a schematic diagram of a shielding pattern in a third sub-pixel according to an embodiment of the present application.
Figure 17C:
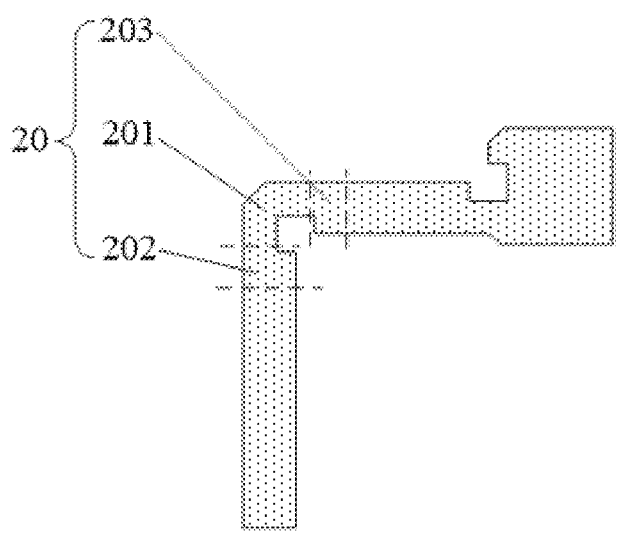
FIG. 17c is a schematic diagram of a conductor pattern in a third sub-pixel according to an embodiment of the present application.

As shown in FIG. 17*a* to FIG. 17*c*, in some embodiments, in the third sub-pixel, there is a first overlap area between an orthographic projection of the shielding pattern 10 onto the base substrate and an orthographic projection of the corner portion 201 onto the base substrate. There is no overlap area between the orthographic projection of the shielding pattern 10 onto the base substrate and an orthographic projection of the first conductor portion 202 onto the base substrate.

Specifically, in the first sub-pixel, the second sub-pixel and the third sub-pixel, the first overlap area between the orthographic projection of the shielding pattern 10 onto the base substrate and the orthographic projection of the corner portion 201 onto the base substrate, is identical.

By setting the orthographic projection of the shielding pattern 10 onto the base substrate not to overlap the orthographic projection of the first conductor portion 202 onto the base substrate, the capacitance value of the shielding capacitor Cap in the third sub-pixel is only related to the first overlap area. By setting suitable first, second and third overlap areas, the shielding capacitor Cap in the first sub-pixel, the shielding capacitor Cap in the second sub-pixel and the shielding capacitor Cap in the third sub-pixel have suitable capacitance values, so that in the first sub-pixel, the second sub-pixel and the third sub-pixel, leakage of the compensation transistor is uniform in a light-emitting stage, and voltages at the N4 node can reach a stable state at the same time.

As shown in FIG. 15*b*, FIG. 16*b* and FIG. 17*b*, in some embodiments, in each sub-pixel, the shielding pattern 10 includes a first sub-pattern 101, a second sub-pattern 102 and a third sub-pattern 103. At least part of the first sub-pattern 101 extends along the first direction. The second sub-pattern 102 extends along the second direction. The second sub-pattern 102 is located between the first sub-pattern 101 and the third sub-pattern 103. The second sub-pattern 102 is electrically coupled with the first sub-pattern 101 and the third sub-pattern 103, respectively. As shown in FIG. 3, there is an overlap area between an orthographic projection of the first sub-pattern 101 onto the base substrate and an orthographic projection of the power signal line VDD in the sub-pixel, which is adjacent the first sub-pattern 101 in the second direction, onto the base substrate. In the overlap area, the first sub-pattern 101 is electrically coupled with the power signal line VDD in the sub-pixel, which is adjacent the first sub-pattern 101 in the second direction. As shown in FIG. 15*a*, FIG. 16*a* and FIG. 17*a*, there is an overlap area between an orthographic projection of the third sub-pattern 103 onto the base substrate and the orthographic projection of the conductor pattern 20 onto the base substrate.

As shown in FIG. 15*b* and FIG. 16*b*, a length of the third sub-pattern 103 in the first sub-pixel along the first direction is greater than a length of the third sub-pattern 103 in the second sub-pixel along the first direction.

Specifically, each shielding pattern 10 includes the first sub-pattern 101, the second sub-pattern 102 and the third sub-pattern 103. There is an overlap area between an orthographic projection of the first sub-pattern 101 onto the base substrate and an orthographic projection of the power signal line VDD in the sub-pixel, which is adjacent the first sub-pattern 101 in the second direction, onto the base substrate. The first sub-pattern 101 is electrically coupled with the power signal line VDD through a via in the overlap area.

In each sub-pixel, each of the orthographic projection of the first sub-pattern 101 onto the base substrate and the orthographic projection of the second sub-pattern 102 onto the base substrate does not overlap the orthographic projection of the conductor pattern 20 onto the base substrate.

In the first sub-pixel and the second sub-pixel, the orthographic projection of the third sub-pattern 103 onto the base substrate overlaps the orthographic projection of the corner portion 201 onto the base substrate and the orthographic projection of the first conductor portion 202 onto the base substrate, respectively. In the third sub-pixel, the orthographic projection of the third sub-pattern 103 onto the base substrate overlaps the orthographic projection of the corner portion 201 onto the base substrate.

By setting the length of the third sub-pattern 103 in the first sub-pixel along the first direction to be greater than the length of the third sub-pattern 103 in the second sub-pixel along the first direction, the second overlap area formed in the first sub-pixel is greater than the third overlap area formed in the second sub-pixel.

By setting the lengths of the third sub-patterns 103 in the first sub-pixel and the second sub-pixel along the first direction, a suitable second overlap area and a suitable third overlap area can be obtained, so that the shielding capacitors Cap in the first sub-pixel and the second sub-pixel have suitable capacitance values. As a result, in the first sub-pixel and the second sub-pixel, leakage of the compensation transistor is uniform in a light-emitting stage, and voltages at the N4 node can reach a stable state at the same time.

As shown in FIG. 15c and FIG. 16c, further, a length of the first conductor portion 202 in the first sub-pixel along the first direction is greater than a length of the first conductor portion 202 in the second sub-pixel along the first direction.

Through the foregoing arrangement, the second overlap area formed in the first sub-pixel is greater than the third overlap area formed in the second sub-pixel.

As shown in FIG. 16b and FIG. 17b, in some embodiments, a length of the third sub-pattern 103 in the second sub-pixel along the first direction is greater than a length of the third sub-pattern 103 in the third sub-pixel along the first direction.

By setting the lengths of the third sub-patterns 103 in the first sub-pixel, the second sub-pixel and the third sub-pixel along the first direction, a suitable first overlap area, a suitable second overlap area and a suitable third overlap area can be obtained, so that the shielding capacitors Cap in the first sub-pixel, the second sub-pixel and the third sub-pixel have suitable capacitance values. As a result, in the first sub-pixel, the second sub-pixel and the third sub-pixel, leakage of the compensation transistor is uniform in a light-emitting stage, and voltages at the N4 node can reach a stable state at the same time.

As shown in FIG. 16c and FIG. 17c, further, a length of the first conductor portion 202 in the second sub-pixel along the first direction is greater than a length of the first conductor portion 202 in the third sub-pixel along the first direction.

In some embodiments, the overlap area in the first sub-pixel is three times the overlap area in the third sub-pixel.

In some embodiments, the overlap area in the second sub-pixel is twice the overlap area in the third sub-pixel.

For example, the capacitance value of the shielding capacitor Cap in the first sub-pixel is 12 fF; the capacitance value of the shielding capacitor Cap in the second sub-pixel is 8 fF; and the capacitance value of the shielding capacitor Cap in the third sub-pixel is 4 fF.

Figure 14:
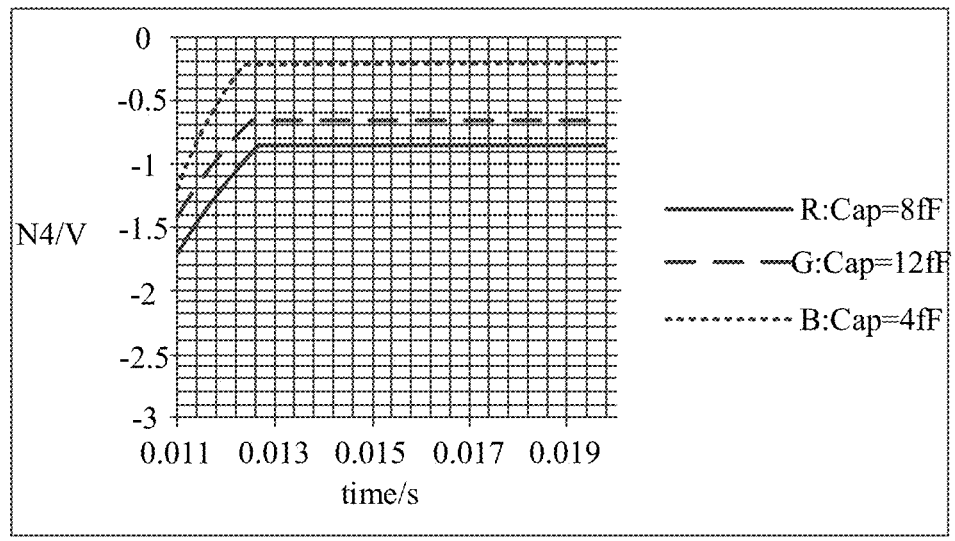
FIG. 14 is a second schematic diagram showing changes of the N4 node in red, green and blue sub-pixels in one frame according to an embodiment of the present application.

As shown in FIG. 14, by setting suitable capacitance values for the shielding capacitor Cap in the first sub-pixel, the shielding capacitor Cap in the second sub-pixel and the shielding capacitor Cap in the third sub-pixel, it can make leakage of the compensation transistor uniform in a light-emitting stage, in the first sub-pixel, the second sub-pixel and the third sub-pixel. In this way, in the first sub-pixel, the second sub-pixel and the third sub-pixel, voltages at the N4 node can reach a stable state at the same time, which can effectively improve the undesirable phenomenon of screen flickering when the display substrate is applied to the display device, thereby improving display image quality of the display device and greatly improving user experience of the display device in application.

In addition, by setting suitable capacitance values for the shielding capacitor Cap in the first sub-pixel, the shielding capacitor Cap in the second sub-pixel and the shielding capacitor Cap in the third sub-pixel, it can effectively shorten the time required for the voltage at the N4 node to reach a stable state, thereby better improving display quality of the display device when the display substrate is applied to the display device.

In some embodiments, the first sub-pixel includes a green sub-pixel; the second sub-pixel includes a red sub-pixel; and the third sub-pixel includes a blue sub-pixel.

Figure 2:
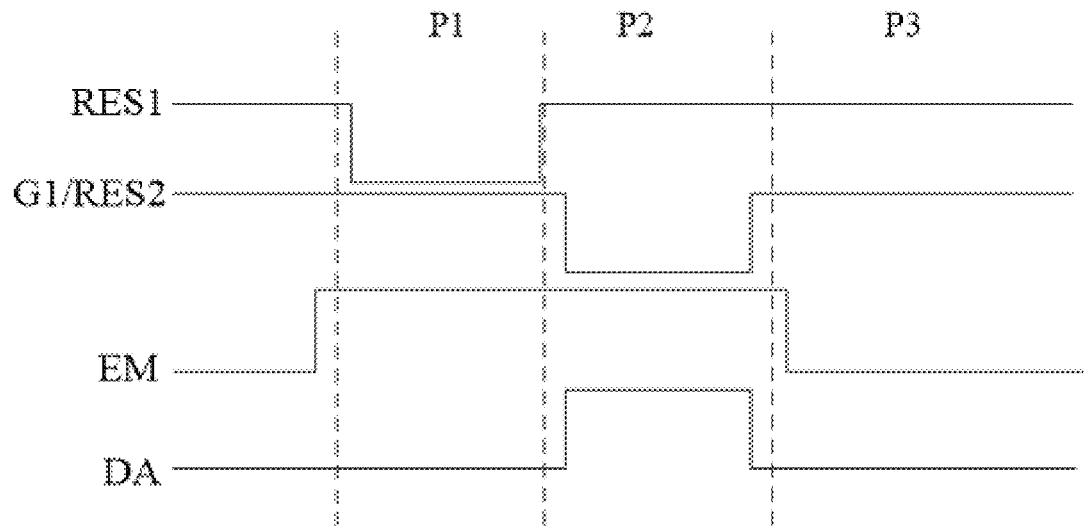
FIG. 2 is an operation flow chart corresponding to the sub-pixel driver circuit shown in FIG. 1.

As shown in FIG. 1 to FIG. 3, in some embodiments, the sub-pixel further includes: a light-emitting element EL, a data line DA, an initialization signal line Vinit, a reset signal line RES1, a gate line G1, and a light-emitting control signal line EM. At least part of the data line DA extends along the first direction. At least part of a pattern of the initialization signal line Vinit, at least part of a pattern of the reset signal line RES1, at least part of a pattern of the gate line G1 and at least part of a pattern of the light-emitting control signal line EM, extend along the second direction.

The sub-pixel driver circuit further includes: a first transistor T1, a fourth transistor T4, a fifth transistor T5, a sixth transistor T6, a seventh transistor T7, and a storage capacitor Cst.

A gate of the first transistor T1 is electrically coupled with the reset signal line RES1. A first terminal of the first transistor T1 is electrically coupled with the initialization signal line Vinit. A second terminal of the first transistor T1 is electrically coupled with a gate of the driver transistor (i.e., the third transistor T3).

A gate of the compensation transistor (i.e., the second transistor T2) is electrically coupled with the gate line G1.

A gate of the fourth transistor T4 is electrically coupled with the gate line G1. A first terminal of the fourth transistor T4 is electrically coupled with the data line DA. A second terminal of the fourth transistor T4 is electrically coupled with a first terminal of the driver transistor.

The first terminal of the driver transistor is electrically coupled with the power signal line VDD through the fifth transistor T5. A gate of the fifth transistor T5 is electrically coupled with the light-emitting control signal line EM. A first terminal of the fifth transistor T5 is electrically coupled with the power signal line VDD. A second terminal of the fifth transistor T5 is electrically coupled with the first terminal of the driver transistor.

A gate of the sixth transistor T6 is electrically coupled with light-emitting control signal line EM. A first terminal of the sixth transistor T6 is electrically coupled with the second terminal of the driver transistor. A second terminal of the sixth transistor T6 is electrically coupled with the light-emitting element.

A gate of the seventh transistor T7 is electrically coupled with the reset signal line RES2 in the next sub-pixel which is adjacent the seventh transistor T7 along the first direction. A first terminal of the seventh transistor T7 is electrically coupled with the initialization signal line Vinit in the next sub-pixel which is adjacent the seventh transistor T7 along the first direction. A second terminal of the seventh transistor T7 is electrically coupled with the light-emitting element.

A first electrode plate of the storage capacitor Cst is reused as the gate of the driver transistor, and a second electrode plate of the storage capacitor Cst is electrically coupled with the power signal line VDD.

For example, each transistor included in the sub-pixel driver circuit employs a P-type transistor; a first terminal of each transistor is a source; and a second terminal of each transistor is a drain. It should be noted that a power signal transmitted on the power signal line VDD is a high-potential direct current signal; a signal transmitted on a negative power signal line VDDVSS is a low-potential direct current signal; and an initialization signal transmitted on the initialization signal line Vinit is a low-potential direct current signal.

As shown in FIG. 2, when the sub-pixel driver circuit of the foregoing structure is in operation, each operation cycle includes a reset period P1, a write compensation period P2, and a light emitting period P3.

In the reset period P1, a reset signal input from the reset signal line RES1 is at an active level, the first transistor T1 is turned on and an initialization signal transmitted by the initialization signal line Vinit is input to the third transistor T3, so that a gate-source voltage Vgs held on the third transistor T3 in the previous frame is cleared, thereby resetting the gate of the third transistor T3.

In the write compensation period P2, the reset signal input from the reset signal line RES1 is at an inactive level, the first transistor T1 is turned off, and a gate scanning signal input from the gate line G1 is at an active level, thereby controlling the second transistor T2 and the four transistors T4 to turn on, so that the data line DA writes a data signal, and the data signal is transmitted to the source of the third transistor T3 through the fourth transistor T4. Meanwhile, the second transistor T2 and the fourth transistor T4 are turned on, so that the third transistor T3 is formed as a diode structure. Then, the second transistor T2, the third transistor T3 and the fourth transistor T4 operate together to realize compensation of a threshold voltage of the third transistor T3. When compensation time is long enough, a gate potential of the third transistor T3 can be controlled to finally reach Vdata+Vth, where Vdata represents a data signal voltage value, and Vth represents the threshold voltage of the third transistor T3.

In the write compensation period P2, a reset signal input from the reset signal line RES2 in the next adjacent sub-pixel along the first direction is at an active level, the seventh transistor T7 is controlled to be turned on, and then an initialization signal transmitted on the initialization signal line Vinit is transmitted to the anode of the light-emitting element EL for controlling the light-emitting element EL not to emit light.

In the light-emitting period P3, a light-emitting control signal written by the light-emitting control signal line EM is at an effective level, and the fifth transistor T5 and the sixth transistor T6 are controlled to be turned on, so that the power signal transmitted by the power signal line VDD is input to the source of the third transistor T3. Meanwhile, since the gate of the third transistor T3 is kept at Vdata+Vth, the third transistor T3 is turned on. The corresponding gate-source voltage of the third transistor T3 is Vdata+Vth−VDD, where VDD is a corresponding voltage value of the power signal. A leakage current generated based on the gate-source voltage flows to the anode of the corresponding light-emitting element EL to drive the corresponding light-emitting element EL to emit light.

One embodiment of the present application further provides a display device, including the display substrate provided in the foregoing embodiment.

It should be noted that the display device may be any product or component with a displaying function such as a television, a monitor, a digital photo frame, a mobile phone, a tablet computer.

In the display substrate provided in the foregoing embodiment of the present application, by setting the overlap area in the first sub-pixel to be greater than the overlap area in the second sub-pixel, a capacitance value of the shielding capacitor Cap in the first sub-pixel is different from a capacitance value of the shielding capacitor Cap in the second sub-pixel. By setting suitable capacitance values for the shielding capacitor Cap in the first sub-pixel and the shielding capacitor Cap in the second sub-pixel, it can make leakage of the compensation transistor uniform in a light-emitting stage, in the first sub-pixel and the second sub-pixel. In this way, in the first sub-pixel and the second sub-pixel, voltages at the N4 node can reach a stable state at the same time, so that there is a difference in brightness of the first sub-pixel and the second sub-pixel only when the voltages at the N4 node are not stable and when the voltages at the N4 node are stable without difference in chromaticity, which can effectively improve the undesirable phenomenon of screen flickering when the display substrate is applied to the display device, thereby improving display image quality of the display device and greatly improving user experience of the display device in application.

Therefore, the display device provided in the embodiment of the present application also has the foregoing beneficial effects as it includes the foregoing display substrate, which will not be repeated here.

One embodiment of the present application further provides a method for manufacturing a display substrate, which may be used for manufacturing the display substrate provided in the foregoing embodiment. The method includes: fabricating multiple sub-pixels arranged in an array on a base substrate. Specific steps of fabricating each sub-pixel include:

fabricating a power signal line VDD with at least part of the power signal line VDD extending along a first direction;

fabricating sub-pixel driver circuits, where each sub-pixel driver circuit includes a driver transistor and a compensation transistor of double-gate structure, a first terminal of the driver transistor is electrically coupled with the power signal line VDD, a first terminal of the compensation transistor is electrically coupled with a second terminal of the driver transistor, a second terminal of the compensation transistor is electrically coupled with a gate of the driver transistor, and an active layer of the compensation transistor includes a first semiconductor pattern, a second semiconductor pattern, and a conductor pattern 20 located between the first semiconductor pattern and the second semiconductor pattern;

fabricating a shielding pattern 10, where the shielding pattern 10 is electrically coupled with the power signal line VDD in the sub-pixel which is adjacent the shielding pattern 10 along the second direction, and there is an overlap area between an orthographic projection of the shielding pattern 10 onto the base substrate and an orthographic projection of the conductor pattern 20 onto the base substrate, and the second direction intersects the first direction;

where the multiple sub-pixels include multiple first sub-pixels and multiple second sub-pixels, and the overlap area in the first sub-pixel is greater than the overlap area in the second sub-pixel.

In the display substrate manufactured by the method provided in the embodiment of the present application, by setting the overlap area in the first sub-pixel to be greater than the overlap area in the second sub-pixel, a capacitance value of the shielding capacitor Cap in the first sub-pixel is different from a capacitance value of the shielding capacitor Cap in the second sub-pixel. By setting suitable capacitance values for the shielding capacitor Cap in the first sub-pixel and the shielding capacitor Cap in the second sub-pixel, it can make leakage of the compensation transistor uniform in a light-emitting stage, in the first sub-pixel and the second sub-pixel. In this way, in the first sub-pixel and the second sub-pixel, voltages at the N4 node can reach a stable state at the same time, so that there is a difference in brightness of the first sub-pixel and the second sub-pixel only when the voltages at the N4 node are not stable and when the voltages at the N4 node are stable without difference in chromaticity, which can effectively improve the undesirable phenomenon of screen flickering when the display substrate is applied to the display device, thereby improving display image quality of the display device and greatly improving user experience of the display device in application.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Such words as "comprises" or "include" mean that an element or object appearing before the word covers elements or objects listed after the word and their equivalents, but do not exclude other elements or objects. Similarly, such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

It will be understood that when an element such as a layer, film, region, or substrate is referred to as being "on" or "under" another element, this element may be "directly" on or "under" the other element, or, there may be an intermediate element therebetween.

In the description of the above embodiments, specific features, structures, materials or characteristics may be combined in any suitable manner in any one or more embodiments or examples.

The above are merely the embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. The protection scope of the present disclosure shall be subject to the protection scope of the claims.

What is claimed is:

1. A display substrate, comprising:
   a base substrate; and
   an array of sub-pixels on the base substrate;
   wherein each sub-pixel includes:
   a power signal line; wherein at least part of the power signal line extends along a first direction;
   sub-pixel driver circuits; wherein each sub-pixel driver circuit includes a driver transistor and a compensation transistor of double-gate structure; a first terminal of the driver transistor is electrically coupled with the power signal line; a first terminal of the compensation transistor of double-gate structure is electrically coupled with a second terminal of the driver transistor; a second terminal of the compensation transistor of double-gate structure is electrically coupled with a gate of the driver transistor; an active layer of the compensation transistor of double-gate structure includes a first semiconductor pattern, a second semiconductor pattern, and a conductor pattern located between the first semiconductor pattern and the second semiconductor pattern;
   a shielding pattern electrically coupled with the power signal line in the sub-pixel which is adjacent the shielding pattern in a second direction; wherein there is an overlap area between an orthographic projection of the shielding pattern onto the base substrate and an orthographic projection of the conductor pattern onto the base substrate; the second direction intersects the first direction;
   wherein the array of sub-pixels include multiple first sub-pixels and multiple second sub-pixels; the overlap area in the first sub-pixel is greater than the overlap area in the second sub-pixel.

2. The display substrate according to claim 1, wherein the array of sub-pixels further include multiple third sub-pixels; and the overlap area in the third sub-pixel is less than the overlap area in the second sub-pixel.

3. The display substrate according to claim 1, wherein in each sub-pixel, the conductor pattern includes a corner portion, a first conductor portion and a second conductor portion; the first conductor portion is electrically connected to a first end of the corner portion; the second conductor portion is electrically connected to a second end of the corner portion; the first conductor portion extends in the first direction, and the second conductor portion extends in the second direction;
   in the first sub-pixel, there is a first overlap area between an orthographic projection of the shielding pattern onto the base substrate and an orthographic projection of the corner portion onto the base substrate, and there is a second overlap area between the orthographic projection of the shielding pattern onto the base substrate and an orthographic projection of the first conductor portion onto the base substrate;
   in the second sub-pixel, there is a first overlap area between an orthographic projection of the shielding pattern onto the base substrate and an orthographic projection of the corner portion onto the base substrate; and there is a third overlap area between the orthographic projection of the shielding pattern onto the base substrate and an orthographic projection of the first conductor portion onto the base substrate, the third overlap area is less than the second overlap area.

4. The display substrate according to claim 3, wherein the array of sub-pixels further include multiple third sub-pixels; and the overlap area in the third sub-pixel is less than the overlap area in the second sub-pixel.

5. The display substrate according to claim 4, wherein in the third sub-pixel, there is a first overlap area between an orthographic projection of the shielding pattern onto the base substrate and an orthographic projection of the corner portion onto the base substrate; there is no overlap area between the orthographic projection of the shielding pattern onto the base substrate and an orthographic projection of the first conductor portion onto the base substrate.

6. The display substrate according to claim 4, wherein in each sub-pixel, the shielding pattern includes a first sub-pattern, a second sub-pattern and a third sub-pattern; at least part of the first sub-pattern extends along the first direction; the second sub-pattern extends along the second direction;

the second sub-pattern is located between the first sub-pattern and the third sub-pattern; the second sub-pattern is electrically coupled with the first sub-pattern and the third sub-pattern, respectively; there is an overlap area between an orthographic projection of the first sub-pattern onto the base substrate and an orthographic projection of the power signal line in the sub-pixel, which is adjacent the first sub-pattern in the second direction, onto the base substrate; the first sub-pattern is electrically coupled with the power signal line in the sub-pixel, which is adjacent the first sub-pattern in the second direction, in the overlap area between the orthographic projection of the first sub-pattern onto the base substrate and the orthographic projection of the power signal line in the sub-pixel, which is adjacent the first sub-pattern in the second direction, onto the base substrate; there is an overlap area between an orthographic projection of the third sub-pattern onto the base substrate and the orthographic projection of the conductor pattern onto the base substrate;
wherein a length of the third sub-pattern in the first sub-pixel along the first direction is greater than a length of the third sub-pattern in the second sub-pixel along the first direction.

7. The display substrate according to claim 6, wherein a length of the first conductor portion in the first sub-pixel along the first direction is greater than a length of the first conductor portion in the second sub-pixel along the first direction.

8. The display substrate according to claim 6, wherein a length of the third sub-pattern in the second sub-pixel along the first direction is greater than a length of the third sub-pattern in the third sub-pixel along the first direction.

9. The display substrate according to claim 8, wherein a length of the first conductor portion in the second sub-pixel along the first direction is greater than a length of the first conductor portion in the third sub-pixel along the first direction.

10. The display substrate according to claim 2, wherein the overlap area in the first sub-pixel is three times the overlap area in the third sub-pixel.

11. The display substrate according to claim 2, wherein the overlap area in the second sub-pixel is twice the overlap area in the third sub-pixel.

12. The display substrate according to claim 2, wherein the first sub-pixel includes a green sub-pixel; the second sub-pixel includes a red sub-pixel; and the third sub-pixel includes a blue sub-pixel.

13. The display substrate according to claim 1, wherein the sub-pixel further includes: a light-emitting element, a data line, an initialization signal line, a reset signal line, a gate line, and a light-emitting control signal line; at least part of the data line extends along the first direction; at least part of the initialization signal line, at least part of the reset signal line, at least part of the gate line and at least part of the light-emitting control signal line, extend along the second direction;
the sub-pixel driver circuit further includes: a first transistor, a fourth transistor, a fifth transistor, a sixth transistor, a seventh transistor, and a storage capacitor;
a gate of the first transistor is electrically coupled with the reset signal line; a first terminal of the first transistor is electrically coupled with the initialization signal line; a second terminal of the first transistor is electrically coupled with a gate of the driver transistor;
a gate of the compensation transistor of double-gate structure is electrically coupled with the gate line;
a gate of the fourth transistor is electrically coupled with the gate line; a first terminal of the fourth transistor is electrically coupled with the data line; a second terminal of the fourth transistor is electrically coupled with a first terminal of the driver transistor;
the first terminal of the driver transistor is electrically coupled with the power signal line through the fifth transistor; a gate of the fifth transistor is electrically coupled with the light-emitting control signal line; a first terminal of the fifth transistor is electrically coupled with the power signal line; a second terminal of the fifth transistor is electrically coupled with the first terminal of the driver transistor;
a gate of the sixth transistor is electrically coupled with light-emitting control signal line; a first terminal of the sixth transistor is electrically coupled with the second terminal of the driver transistor; a second terminal of the sixth transistor is electrically coupled with the light-emitting element;
a gate of the seventh transistor is electrically coupled with the reset signal line in the next sub-pixel which is adjacent the seventh transistor along the first direction; a first terminal of the seventh transistor is electrically coupled with the initialization signal line in the next sub-pixel which is adjacent the seventh transistor along the first direction; a second terminal of the seventh transistor is electrically coupled with the light-emitting element;
a first electrode plate of the storage capacitor is reused as the gate of the driver transistor, and a second electrode plate of the storage capacitor is electrically coupled with the power signal line.

14. A display device, comprising a display substrate;
wherein the display substrate includes:
a base substrate; and
an array of sub-pixels on the base substrate;
wherein each sub-pixel includes:
a power signal line; wherein at least part of the power signal line extends along a first direction;
sub-pixel driver circuits; wherein each sub-pixel driver circuit includes a driver transistor and a compensation transistor of double-gate structure; a first terminal of the driver transistor is electrically coupled with the power signal line; a first terminal of the compensation transistor of double-gate structure is electrically coupled with a second terminal of the driver transistor; a second terminal of the compensation transistor of double-gate structure is electrically coupled with a gate of the driver transistor; an active layer of the compensation transistor of double-gate structure includes a first semiconductor pattern, a second semiconductor pattern, and a conductor pattern located between the first semiconductor pattern and the second semiconductor pattern;
a shielding pattern electrically coupled with the power signal line in the sub-pixel which is adjacent the shielding pattern in a second direction; wherein there is an overlap area between an orthographic projection of the shielding pattern onto the base substrate and an orthographic projection of the conductor pattern onto the base substrate; the second direction intersects the first direction;
wherein the array of sub-pixels include multiple first sub-pixels and multiple second sub-pixels; the overlap area in the first sub-pixel is greater than the overlap area in the second sub-pixel.

15. The display device according to claim 14, wherein the array of sub-pixels further include multiple third sub-pixels;

and the overlap area in the third sub-pixel is less than the overlap area in the second sub-pixel.

16. The display device according to claim 15, wherein in each sub-pixel, the conductor pattern includes a corner portion, a first conductor portion and a second conductor portion; the first conductor portion is electrically connected to a first end of the corner portion; the second conductor portion is electrically connected to a second end of the corner portion; the first conductor portion extends in the first direction, and the second conductor portion extends in the second direction;
  in the first sub-pixel, there is a first overlap area between an orthographic projection of the shielding pattern onto the base substrate and an orthographic projection of the corner portion onto the base substrate, and there is a second overlap area between the orthographic projection of the shielding pattern onto the base substrate and an orthographic projection of the first conductor portion onto the base substrate;
  in the second sub-pixel, there is a first overlap area between an orthographic projection of the shielding pattern onto the base substrate and an orthographic projection of the corner portion onto the base substrate; and there is a third overlap area between the orthographic projection of the shielding pattern onto the base substrate and an orthographic projection of the first conductor portion onto the base substrate, the third overlap area is less than the second overlap area;
  in the third sub-pixel, there is a first overlap area between an orthographic projection of the shielding pattern onto the base substrate and an orthographic projection of the corner portion onto the base substrate; there is no overlap area between the orthographic projection of the shielding pattern onto the base substrate and an orthographic projection of the first conductor portion onto the base substrate.

17. The display device according to claim 16, wherein in each sub-pixel, the shielding pattern includes a first sub-pattern, a second sub-pattern and a third sub-pattern; at least part of the first sub-pattern extends along the first direction; the second sub-pattern extends along the second direction; the second sub-pattern is located between the first sub-pattern and the third sub-pattern; the second sub-pattern is electrically coupled with the first sub-pattern and the third sub-pattern, respectively; there is an overlap area between an orthographic projection of the first sub-pattern onto the base substrate and an orthographic projection of the power signal line in the sub-pixel, which is adjacent the first sub-pattern in the second direction, onto the base substrate; the first sub-pattern is electrically coupled with the power signal line in the sub-pixel, which is adjacent the first sub-pattern in the second direction, in the overlap area between the orthographic projection of the first sub-pattern onto the base substrate and the orthographic projection of the power signal line in the sub-pixel, which is adjacent the first sub-pattern in the second direction, onto the base substrate; there is an overlap area between an orthographic projection of the third sub-pattern onto the base substrate and the orthographic projection of the conductor pattern onto the base substrate;

wherein a length of the third sub-pattern in the first sub-pixel along the first direction is greater than a length of the third sub-pattern in the second sub-pixel along the first direction;
  a length of the first conductor portion in the first sub-pixel along the first direction is greater than a length of the first conductor portion in the second sub-pixel along the first direction;
  a length of the third sub-pattern in the second sub-pixel along the first direction is greater than a length of the third sub-pattern in the third sub-pixel along the first direction;
  a length of the first conductor portion in the second sub-pixel along the first direction is greater than a length of the first conductor portion in the third sub-pixel along the first direction.

18. The display device according to claim 15, wherein the overlap area in the first sub-pixel is three times the overlap area in the third sub-pixel;
  the overlap area in the second sub-pixel is twice the overlap area in the third sub-pixel.

19. The display device according to claim 15, wherein the first sub-pixel includes a green sub-pixel; the second sub-pixel includes a red sub-pixel; and the third sub-pixel includes a blue sub-pixel.

20. A method for manufacturing the display substrate according to claim 1, comprising: fabricating sub-pixels arranged in an array on a base substrate;
  wherein each sub-pixel is fabricated in a way including:
    fabricating a power signal line with at least part of the power signal line extending along a first direction;
    fabricating sub-pixel driver circuits, wherein each sub-pixel driver circuit includes a driver transistor and a compensation transistor of double-gate structure, a first terminal of the driver transistor is electrically coupled with the power signal line, a first terminal of the compensation transistor of double-gate structure is electrically coupled with a second terminal of the driver transistor, a second terminal of the compensation transistor of double-gate structure is electrically coupled with a gate of the driver transistor, and an active layer of the compensation transistor of double-gate structure includes a first semiconductor pattern, a second semiconductor pattern, and a conductor pattern located between the first semiconductor pattern and the second semiconductor pattern;
  fabricating a shielding pattern, wherein the shielding pattern is electrically coupled with the power signal line in the sub-pixel which is adjacent the shielding pattern along the second direction, and there is an overlap area between an orthographic projection of the shielding pattern onto the base substrate and an orthographic projection of the conductor pattern onto the base substrate, and the second direction intersects the first direction;
  wherein the array of sub-pixels include multiple first sub-pixels and multiple second sub-pixels, and the overlap area in the first sub-pixel is greater than the overlap area in the second sub-pixel.

* * * * *